United States Patent [19]

Moore et al.

[11] Patent Number: 4,605,949

[45] Date of Patent: Aug. 12, 1986

[54] SEMICONDUCTOR DEVICE WITH INTERDIGITATED ELECTRODES

[75] Inventors: Michael J. Moore, Poynton; David H. Paxman, Redhill, both of England

[73] Assignee: U.S. Philips Corporation, New York, N.Y.

[21] Appl. No.: 634,892

[22] Filed: Jul. 26, 1984

[30] Foreign Application Priority Data

Aug. 26, 1983 [GB] United Kingdom ............... 8322977

[51] Int. Cl.⁴ .......................................... H01L 23/48
[52] U.S. Cl. ........................................ 357/71; 357/68; 357/65
[58] Field of Search ..................... 357/38, 81, 36, 71, 357/79, 65, 68

[56] References Cited

U.S. PATENT DOCUMENTS

| | | | |
|---|---|---|---|
| 3,525,910 | 8/1970 | Philips | 357/79 |
| 3,619,738 | 11/1971 | Otsuka | 357/38 |
| 3,969,745 | 7/1976 | Blocker | 357/71 |

Primary Examiner—Andrew J. James
Assistant Examiner—Mark Prenty
Attorney, Agent, or Firm—Robert T. Mayer; Steven R. Biren

[57] ABSTRACT

A semiconductor device, such as a gate turn-off thyristor, has, at a major surface of a semiconductor body a plurality of electrode fingers alternately contacting opposite conductivity type regions (e.g. the cathode and gate) of the semiconductor body. In order to save useful semiconductor area and to allow an improved electrode geometry bonding pads for the electrodes are formed at a level above the electrodes. An insulating layer separates the bonding pads and the electrodes. A first bonding pad contacts a first set of electrode fingers through a first set of windows in the insulating layer and a second bonding pad contacts a second set of electrode fingers through a second set of windows. In operation, the voltage drop along each electrode finger of a set is substantially equal. A third bonding pad may also contact the second electrode set through a third set of windows in the insulating layer.

9 Claims, 4 Drawing Figures

SEMICONDUCTOR DEVICE WITH INTERDIGITATED ELECTRODES

BACKGROUND OF THE INVENTION

This invention relates to a semiconductor device, and more particularly to a semiconductor device having at a major surface of a semiconductor body alternate regions of opposite conductivity type, a first set of electrode fingers at a first metallization level on said major surface and contacting the regions of a first conductivity type, and a second set of electrode fingers at the first metallization level on said major surface and contacting the regions of the second opposite conductivity type. The invention also relates to a method of manufacturing such a semiconductor device.

A semiconductor device having the features mentioned above is described hereinafter as having an interdigitated electrode configuration. High voltage power semiconductor devices such as a gate turn-off thyristor (hereinafter referred to as a "GTO") and a high voltage bipolar transistor may adopt such an interdigitated electrode configuration in order to optimize high frequency switching performance.

A so-called gate controlled switch (which is synonymous with a GTO) having the features mentioned above is known from the paper by Hayashi et al. entitled "A High-Power Gate-Controlled Switch Using New Life Time Control Method" which appeared in IEEE Transactions on Electron Devices, Vol. ED-28, No. 3, Mar. 1981, at pages 246–251 (see particularly FIG. 4). This shows a semiconductor device comprising a semiconductor body having at a major surface alternate regions of opposite conductivity types. A first set of electrode fingers contacts the regions of a first conductivity type and a second set of electrode fingers contacts the regions of the second opposite conductivity type. The first and second sets of electrodes are thus arranged in an interdigitated configuration at the same metallization level. A first electrically conductive bonding pad is electrically connected to the electrodes of the first set, and a second electrically conductive bonding pad which is at the same metallization level as the first bonding pad and which is electrically isolated from the first bonding pad is electrically connected to the electrodes of the second set.

For both GTOs and high voltage bipolar power transistors the interdigitated electrode configuration comprises two sets of electrode fingers. One set of electrode fingers constitutes a main current-carrying electrode and the other set of electrode fingers constitutes a control electrode. The main current-carrying electrode, which is the cathode in the case of a GTO and the emitter electrode in the case of a power transistor, may carry high currents of 1 amp and upwards. The control electrode, which is the gate electrode for a GTO and the base electrode for a power transistor, may carry a current ranging from hundreds of milliamps to several amps.

As shown in the above-mentioned paper by Hayashi et al the cathode electrode fingers are electrically connected to a bonding pad at the center of the device and the gate electrode fingers are electrically connected to two bonding pads at diametrically opposed corners of the device. All the bonding pads are relatively large in area so that large diameter wires can be bonded thereto for high current handling capability. The bonding pads are formed on an insulating layer at the same major surface of the semiconductor body as the two sets of electrodes. Moreover, the bonding pads are at the same metallization level as the electrode fingers. The metallization thus has a comb-like configuration. However, because none of the bonding pads forms part of the interdigitated configuration, they do not usefully contribute to the device's switching properties and from this viewpoint they waste useful area of the semiconductor surface. In general the total bonding pad area is not insignificant and may be more than one third of the overall useful device area.

Furthermore with such a device it is necessary to provide over the top of the interdigitated electrode configuration a protective layer to guard against damage of the fine electrode structure.

Also, with this prior art device the various electrode fingers have different lengths which may, during operation, give rise to different voltage drops along different electrode fingers causing uneven current density distribution and a non-uniform turn-off characteristic. In fact, current localization may even limit turn-off performance of the device.

A semiconductor device is known which, compared with the device described above, achieves a saving in useful area occupied by the bonding pads. In this case the device has a mesa configuration. One set of electrode fingers is provided on the mesa plateaux and the second set of electrode fingers in the troughs. Thus one set of electrode fingers is at a higher level than the other set so that a plate-like bonding pad can be provided in contact with the electrode fingers at the upper level, but electrically isolated from the electrode fingers at the lower level. The lower-level electrode fingers are integral with and so electrically connected to a bonding pad which is present on an insulating layer at the surface of the semiconductor body. Thus although this device goes some way to solving the problem of wasting useful device area it still occupies useful area for the bonding pad (or pads) for one of the sets of electrode fingers.

British Patent GB No. 1322141 discloses a transistor (see FIG. 4) in which the base and emitter are present as alternate regions of opposite conductivity type at the major surface of a semiconductor body. The base is contacted by electrode fingers formed by a platinum silicide grid surrounding each emitter region. An insulating layer is disposed over the grid and has emitter contact windows exposing each emitter region at the surface. An emitter contact layer forming a bonding pad is disposed over the insulating layer and extends into the windows, directly contacting the emitter regions. The emitter bonding pad is thus provided at a second metallization level over the active area of the transistor, which again goes some way to saving useful device area. However, the bonding pads for the base are disposed on an insulating layer at the surface of the semiconductor body outside the active area of the transistor, and therefore still occupy useful device area. It is noted also that this device has only one set of electrode fingers, viz. the base grid, which are formed at a first metallization level because the emitter regions are contacted directly by the emitter bonding pad at the second metallization level. In both its structure and manufacture, this transistor differs markedly from the GTO disclosed by Hayashi et al, which in these respects is more akin to the device of the present invention.

In European Patent application No. 0,051,459 there is disclosed a G.T.O device in which the two sets of interdigitated electrode fingers are contacted by two thin comb-like copper foils in an interdigitated manner. The foils themselves can be used instead of wire bonds for the electrical connections, thus dispensing altogether with the need for bonding pads. However this solution is not wholly satisfactory because it introduces new problems. For example, the copper foil has to be made separately and then positioned and fixed to the semiconductor device. Not only is the foil delicate and so prone to damage but the dimensions can be so small that alignment with the fine electrode fingers is very difficult and consequently undesirable short-circuits may result. To overcome the problem of delicacy the foil may be provided with a backing film for reinforcement but this inevitably adds to the expense and complexity of manufacture. The expense is already relatively high because of the soft soldering process employed and the materials used therefor. Moreover the choice of material for the backing film is limited because it must be transparent to enable visual alignment of the foil and the electrode fingers below.

SUMMARY OF THE INVENTION

According to a first aspect of the present invention a semiconductor device comprising a semiconductor body having at a major surface alternate regions of opposite conductivity types, a first set of electrode fingers at a first metallization level on said major surface and contacting the regions of a first conductivity type, a second set of electrode fingers at the first metallization level on said major surface and contacting the regions of the second opposite conductivity type, a first electrically conductive bonding pad electrically connected to the electrode fingers of the first set, and a second electrically conductive bonding pad at the same metallization level as the first bonding pad, which second bonding pad is electrically isolated from the first bonding pad and which is electrically connected to the electrode fingers of the second set, is characterized in that an insulating layer overlies the two sets of electrode fingers, the first bonding pad extends at a second metallization level on the insulating layer transversely over the electrode fingers and is electrically connected to the first set of electrode fingers through at least one window in the insulating layer such that in operation of the device the voltage drop along each electrode finger of said first set is substantially equal, and the second bonding pad extends at the second metallization level on the insulating layer transversely over the electrode fingers and is electrically connected to the second set of electrode fingers through at least one other window in the insulating layer such that in operation of the device the voltage drop along each electrode finger of said second set is substantially equal.

Thus, a semiconductor device in accordance with the invention has the electrode fingers confined to a first metallization level directly on the semiconductor surface and the bonding pads are at a second metallization level directly above the electrode fingers. That is to say the bonding pads overlie the active area of the device. Therefore, compared with the Hayashi et al prior art device having equivalent electrical characteristics, it is possible to reduce the size of the semiconductor body by an area corresponding to the area of the bonding pads. Alternatively, the area of the semiconductor body which would have been occupied by bonding pads can be used to increase the area of the interdigitated electrode configuration therby increasing the current-handling capabilities of the device. Moreover, because the electrode fingers are at a different level to the bonding pads they may be provided as discrete equally long strips, which is a preferred geometry from an electrical viewpoint. In operation the voltage drop along each electrode finger of a set is substantially equal and this makes for a favorable current density distribution and turn-off characteristic.

Also, because the bonding pads do not take up any useful area they are not restricted in size and the total area occupied by the bonding pads may correspond closely to the area occupied by the underlying electrode configuration. The advantage of large bonding pads is that it facilitates mechanization and automation so that, for example, it is easier to arrange for automatic ultrasonic wire bonding to be carried out. The large bonding pads also allow a wider choice of bonding methods and, for example, soft soldering becomes possible.

Another advantage of a device in accordance with the invention is that the bonding pads and the subjacent insulating layer provide protection for the electrode fingers without it being necessary to provide an additional layer especially for that purpose.

Moreover, in contrast with the device disclosed in European Patent Application No. 0,051,459, a device in accordance with the invention avoids the need to make and then accurately to align a separate, delicate component. Instead electrical contact is made to the electrode fingers by bonding pads formed using techniques which are well-known in their own right.

Additionally there is the advantage that a device in accordance with the present invention allows a high degree of design flexibility in the location of the windows in the insulating layer and in the siting and shaping of the bonding pads. Thus, for example, the windows in the insulating layer can be located so as to minimize the adverse voltage drop caused by the inherent electrical resistance of the electrode fingers, thereby mitigating problems of local concentration of current mentioned above. Also, the bonding pads can be sited and shaped in view of the application for the particular device in question. Moreover the number of bonding pads is not restricted so that, for example, a third bonding pad may be included at the same metallization level as the first and second bond pads which third bonding pad, like the second bonding pad, is electrically connected to the second set of electrode fingers. This can further help to alleviate problems associated with the resistance of the electrode fingers. In this case it is preferable that the first bonding pad is disposed intermediate the second and third bonding pads.

According to a further aspect of the present invention there is provided a method of manufacturing a semiconductor device in accordance with the first aspect of the invention, including the steps of providing at a major surface of a semiconductor body alternate regions of opposite conductivity type, and subsequently forming on said major surface a first and a second set of electrode fingers, the first set of electrode fingers contacting the regions of a first conductivity type and the second set of electrode fingers contacting the regions of the second opposite conductivity type, characterized by the steps of providing an insulating layer over the two sets of electrode fingers and over exposed parts of the major surface of the semiconductor body, forming at least one window in the insulating layer for electrically contacting the first set of electrode fingers, forming at least one other window in the insulating layer for electrically contacting the second set of electrode fingers, providing a layer of electrically conductive material on the insulating layer and in the windows, and defining in the conductive layer first and second bonding pads which extend transversely over the electrode fingers, the first bonding pad being electrically connected to the first set of electrode fingers through said one window such that in operation of the device the voltage drop along each electrode finger of said first set is substantially equal, and the second bonding pad being electrically connected to the second set of electrode fingers through said one other window such that in operation of the device the voltage drop along each electrode finger of said second set is substantially equal.

BRIEF DESCRIPTION OF THE DRAWING

Embodiments of the invention will now be described, by way of example, with reference to the accompanying drawing, in which.

It is noted that for the sake of clarity the figures are not drawn to scale.

DESCRIPTION OF THE PREFERRED EMBODIMENTS

Figure 1:
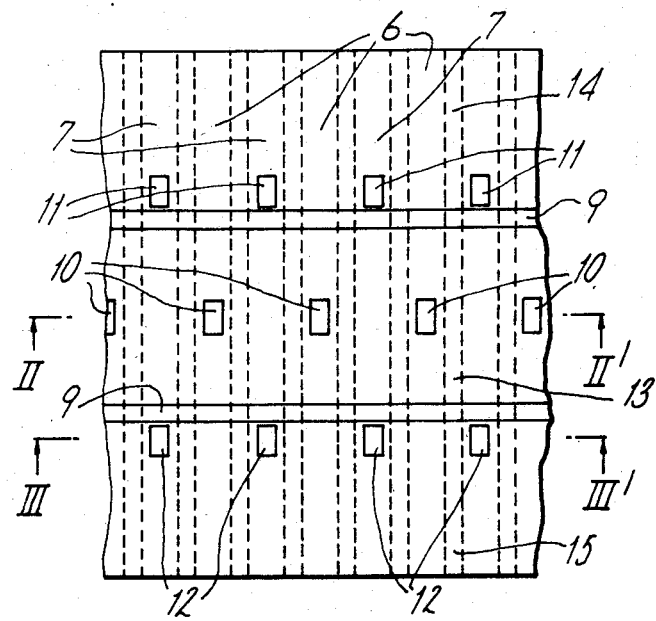
FIG. 1 is a plan view of part of a semiconductor device in accordance with the invention.
Figure 2:
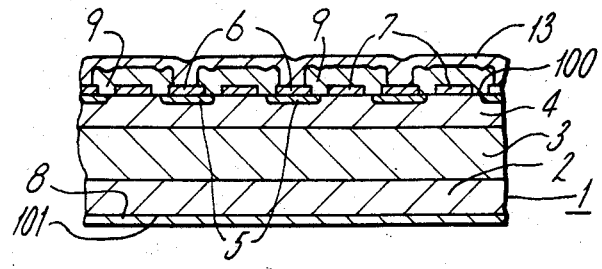
FIG. 2 is a cross-section taken on the line II—II of FIG. 1.
Figure 3:
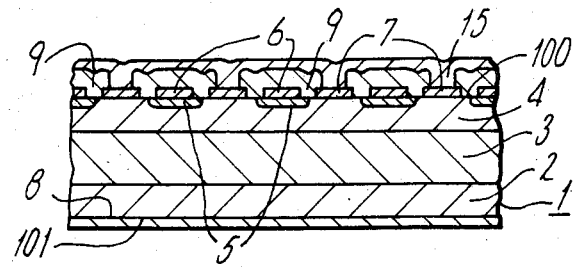
FIG. 3 is a cross-section taken on the line III—III of FIG. 1.

The semiconductor device shown in FIGS. 1 to 3 is part of a GTO formed from a semiconductor body 1 having a conventional four layer pnpn structure as follows: a p-type emitter layer 2, an n-type base layer 3, a p-type base layer 4 and a plurality of mutually parallel strip-shaped n-type emitter regions 5. Thus at the major surface 100 of the semiconductor body the emitter regions 5 and the base layer 4 present alternate regions of opposite conductivity type. Each of the regions 5 may be, for example, approximately 50 micrometers wide and approximately 6 mm long. The spacing between adjacent regions 5 may be, for example, approximately 50 micrometers. The number of regions 5 depends on the current-handling capabilities of the GTO element and there may be, for example 60 such emitter regions.

The device as described so far is made in the conventional manner for a four-layer semiconductor device using techniques which are well-known in the power semiconductor art and so no further details will be given here.

On the surface 100 of the semiconductor body the n-type emitter regions 5 are each contacted by a cathode electrode finger 6 which may be approximately 6 mm long and 40 micrometers wide. On the same surface 100 and between each pair of electrode fingers 6 is located a gate electrode finger 7 in contact with the surface adjoining regions of the p-type base layer 4 intermediate the emitter regions. The gate electrode fingers 7 may have a similar size and shape to the cathode electrode fingers 6 and thus may be 6 mm long and 40 micrometers wide. The spacing between adjacent fingers 6 and 7 is 10 micrometers. The electrode fingers 6 and 7 are thus arranged in an alternating configuration. An anode electrode 8 is present on the opposite major surface 101 in contact with the p-type emitter layer 2.

The anode electrode 8 and the electrode fingers 6 and 7 are formed by vapor-depositing aluminum to a thickness of approximately 5 micrometers on the major surfaces 101 and 100 respectively. The electrode fingers 6 and 7 are defined using conventional photolithographic and etching techniques.

A layer 9 of insulating material overlies the electrode fingers 6,7 and the exposed areas of the semiconductor surface 100. Layer 9 may be, for example, a 1 micrometer thick layer of polyimide initially deposited over the whole upper surface of the electrode fingers 6,7 and the exposed semiconductor surface 100 by spinning. Subsequently, using photolithographic and etching, techniques windows are opened in the insulating layer 9 to expose parts of the electrode fingers 6,7 as described below. The size of the windows may be, for example, approximately 50 micrometers in the direction parallel to the electrode fingers and 30 micrometers in the direction transverse thereto. However it is noted here that especially in the direction parallel to the electrode fingers the dimension of the windows may be varied over a wide range and may, for example, be extended to approximately 2 mm long.

For the sake of clarity in the plan views of FIGS. 1 and 3 the windows in the insulating layer are represented as solid lines.

A first set of windows 10 is formed in registration with the underlying cathode electrode fingers 6 approximately mid-way along the length of the fingers. A second set of windows 11 is formed in registration with the underlying gate electrode fingers 7 approximately 2 mm from the ends of the gate electrode fingers 7, and a third set of windows 12 is formed again in registration with the underlying gate electrode fingers 7 at the same distance of approximately 2 mm from the other end of the gate electrode fingers 7.

A layer of aluminum approximately 5 micrometers thick is then deposited on the insulating layer 9 and in the sets of windows 10,11 and 12. The aluminum layer in the first set of windows 10 electrically contacts the underlying cathode electrode fingers 6 individually, and in the second and third sets of windows contacts the gate electrode fingers 7 individually. The aluminum layer is then divided using conventional photolithographic and etching techniques into three rectangular portions 13,14,15 of approximately equal area which extend transversely over the electrode fingers. The width of each of the portions, i.e. in a direction parallel to the length of the electrode fingers 6,7 is approximately 2 mm but with adjacent portions spaced apart by approximately 100 micrometers. The central portion 13 forms the cathode bonding pad, and outer portions 14 and 15 form the gate bonding pads. Thus the cathode bonding pad 13 is electrically connected to the cathode electrode fingers 6 and the gate bonding pads are electrically connected to the gate electrode fingers 7. Wire connections can be made to these bonding pads 13,14,15 using for example known ultrasonic wire bonding for connecting the gate and cathode to the external terminals of an encapsulating package not shown in the Figures. As mentioned earlier, the large area of these bonding pads facilitates mechanization and automation and allows a wider choice of bonding methods. The anode electrode 8 is also connected to an external terminal of the package in known manner.

Although not shown in the figures, it is noted that the periphery of the GTO element may be passivated using a conventional passivation scheme, for example, using a plurality of annular guard rings at the major surface 100 of the semiconductor body with an overlying passivating layer system comprising semi-insulating material directly on the surface 100.

Figure 4:
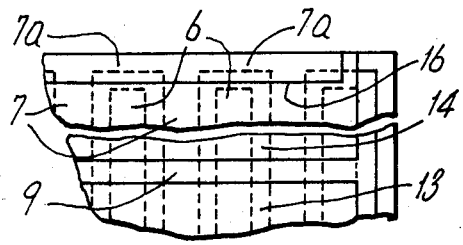
FIG. 4 is a plan view of part of another device in accordance with the invention.

In the device described above each of the electrode fingers is contacted by the metal of the bonding pads through an individual window. FIG. 4 shows a modified arrangement in which the cathode electrode fingers 6 are the same as previously shown but the gate electrode fingers 7 are interconnected around the full periphery of the interdigitated electrode configuration by portions 7a which are part of the same metallization as the electrode fingers 6,7 and are formed simultaneously therewith. In this case only a single window 16 is needed for contacting the gate electrode fingers 7, this window 16 being in registration with the electrode finger interconnect portions 7a. The window 16 may be for example 6 mm long and 30 micrometers wide. In this case the gate bond pad 14 overlies the window 16. Although not shown in the accompanying drawing, a similar single window may be used for contacting equivalent interconnect portions at the other ends of the gate electrode fingers 7.

It is noted here that while the description above has been in terms of manufacturing a single GTO, it would be usual to form a plurality of similar devices simultaneously in a single wafer of semiconductor material and then to divide the wafer to form the separate GTO elements.

It will be evident in the light of the description given here that many modifications are possible within the scope of the invention. Thus, for example the gate and cathode electrode fingers may be formed as concentric annuli instead of alternating parallel strips as described above. In this case the bonding pads may have an arcuate or segmented form rather than being rectangular. Moreover the device may be any device having an interdigitated electrode configuration, for example a high voltage bipolar transistor in which case, referring to FIG. 1 which equally shows a plan view of a transistor in accordance with the invention, the bonding pad 13 would contact the emitter and the bonding pads 14 and 15 would both contact the base.

Finally, it is noted that in the present context the term "metallization level" is used merely in its structural sense as indicating the relative level at which an electrode or bonding pad is formed, and may apply equally to an electrically conductive material, such as polycrystalline silicon, which is not a metal.

We claim:

1. A semiconductor device comprising a semiconductor body having a major surface and alternate regions of opposite first and second conductivity types at said major surface, a first set of electrode fingers at a first metallization level on said major surface and contacting the regions of the first conductivity type, a second set of electrode fingers at the first metallization level on said major surface and contacting the regions of the second conductivity type, a first electrically-conductive bonding pad at a second metallization level and electrically connected to the electrode fingers of the first set, and a second electrically conductive bonding pad at said second metallization level, which second bonding pad is electrically isolated from the first bonding pad and is electrically connected to the electrode fingers of the second set, and and insulating layer overlying the two sets of electrode fingers, the first bonding pad extending at the second metallization level on the insulating layer transversely over the electrode fingers and being electrically connected to the first set of electrode fingers through at least one window in the insulating layer such that in operation of the device the voltage drop along each electrode finger of said first set is substantially equal, and the second bonding pad extending at the second metallization level on the insulating layer transversely over the electrode fingers an being electrically connected to the second set of electrode fingers through at least one other window in the insulating layer such that in operation of the device the voltage drop along each electrode finger of said second set is substantially equal.

2. A semiconductor device as claimed in claim 1, characterized in that the first bonding pad is electrically connected individually to each electrode finger of the first set through a first set of windows in the insulating layer.

3. A semiconductor device as claimed in 2, characterized in that the windows of the first set are disposed substantially mid-way along the length of the electrode fingers of the first set.

4. A semiconductor device as claimed in claim 1, 2 or 3 characterized in that the second bonding pad is electrically connected individually to each electrode finger of the second set through a second set of windows in the insulating layer.

5. A semiconductor device as claimed in claim 4, characterized in that the second set of windows is spaced apart from the extremities of the electrode fingers.

6. A semiconductor device as claimed in claim 1, 2 or 3, characterized in that a third electrically conductive bonding and extends at the same metallization level as the first and second bonding pads on the insulating layer transversely to the electrode fingers and is electrically connected to the second set of electrode fingers through at least one further window in said insulating layer.

7. A semiconductor device as claimed in claim 6, characterized in that the first bonding pad is disposed intermediate the second and third bonding pads.

8. A semiconductor device as claimed in claim 6, characterized in that the third bonding pad is electrically connected individually to each electrode finger of the second set through a third set of windows in the insulating layer.

9. A semiconductor device as claimed in claim 8, characterized in that the third set of windows is spaced apart from the extremities of the electrode fingers.

* * * * *

UNITED STATES PATENT AND TRADEMARK OFFICE
CERTIFICATE OF CORRECTION

PATENT NO. : 4,605,949

DATED : August, 12, 1986

INVENTOR(S) : MICHAEL J. MOORE ET AL

It is certified that error appears in the above-identified patent and that said Letters Patent is hereby corrected as shown below:

IN THE CLAIMS:

Col. 8, line 17, change "an" to --and--.

Signed and Sealed this

Second Day of December, 1986

Attest:

DONALD J. QUIGG

Attesting Officer      Commissioner of Patents and Trademarks